United States Patent [19]

Wenzel

[11] Patent Number: 4,933,020
[45] Date of Patent: Jun. 12, 1990

[54] SOLAR INSTALLATION

[76] Inventor: Joachim Wenzel, 7000 Stuttgart 1, Hauptmannsreute 46, Fed. Rep. of Germany

[21] Appl. No.: 202,740

[22] Filed: Jun. 6, 1988

[30] Foreign Application Priority Data

Jun. 6, 1987 [DE] Fed. Rep. of Germany ....... 3719099
Feb. 23, 1988 [DE] Fed. Rep. of Germany ... 8802322[U]

[51] Int. Cl.⁵ .............................................. H02N 6/00
[52] U.S. Cl. .................................. 136/246; 136/248; 126/439
[58] Field of Search ................ 136/246, 248; 126/439; 52/173 R

[56] References Cited

U.S. PATENT DOCUMENTS 3,991,741 11/1976 Northrup, Jr. et al. ............. 126/425
4,078,603 3/1978 Saunders ................................. 165/48
4,296,731 10/1981 Cluff .................................... 126/424

FOREIGN PATENT DOCUMENTS 0230227 7/1987 European Pat. Off. ............ 126/439
3600881 7/1987 Fed. Rep. of Germany ...... 126/439
3719099 10/1987 Fed. Rep. of Germany ...... 126/439
60-178671 9/1985 Japan .................................... 136/246

Primary Examiner—Aaron Weisstuch
Attorney, Agent, or Firm—William A. Drucker

[57] ABSTRACT

A solar installation having a collector field having at least one of planar absorbers and solar cells, the collector field being fixed in non-trackable manner of the roof, reflecting surfaces extending laterally over and beyond the absorber surfaces in shading free manner with respect to the absorbers and/or solar cells, the reflecting surfaces having associated carrier members, the reflecting surfaces with the associated carrier members being subdivided into at least two reflecting surfaces in a plane extending horizontally from the absorbers and/or solar cells, the inclinations of the reflecting surfaces increasing with increase in distance of the absorbers or solar cells from the horizontal, and a spacing between at least two of the reflecting surfaces.

12 Claims, 5 Drawing Sheets

SOLAR INSTALLATION

BACKGROUND OF THE INVENTION

The present invention relates to a solar installation with essentially planar absorbers and/or solar cells in a collector field.

The preceding, but not previously published German Pat. No. 36 00 881 already solves the problem if equipping a solar installation with mirrors or reflectors and absorber surfaces and/or solar cells, in which use is not only made of the direct solar radiation, but also the early morning and late evening sunrays without there being any solar tracking of the reflector or absorber surfaces. Thus, additional solar radiation is used, particularly morning and evening, without impeding the action of the reflectors at midday or at other times by any shading effect.

SUMMARY OF THE INVENTION

The problem of the present invention is to so improve said solar installation, that the effective reflecting surface can be enlarged.

This problem is solved in that the reflecting surfaces are subdivided in each case into two reflecting surfaces, whose inclinations increase with increasing distance from a horizontal plane extending from the absorbers. Thus, the total radiation is deflected more strongly than hitherto onto the absorbers, so that there is a certain additional concentration.

Thus, the effective reflecting surface can be increased, so that it is possible to obtain correspondingly higher temperatures for lower costs or a correspondingly higher power or performance for the solar cells.

BRIEF DESCRIPTION OF THE DRAWINGS

The invention is described in greater detail hereinafter relative to non-limitative embodiments and the attached drawings, wherein.

DETAILED DESCRIPTION OF THE PREFERRED EMBODIMENTS.

Figure 1:
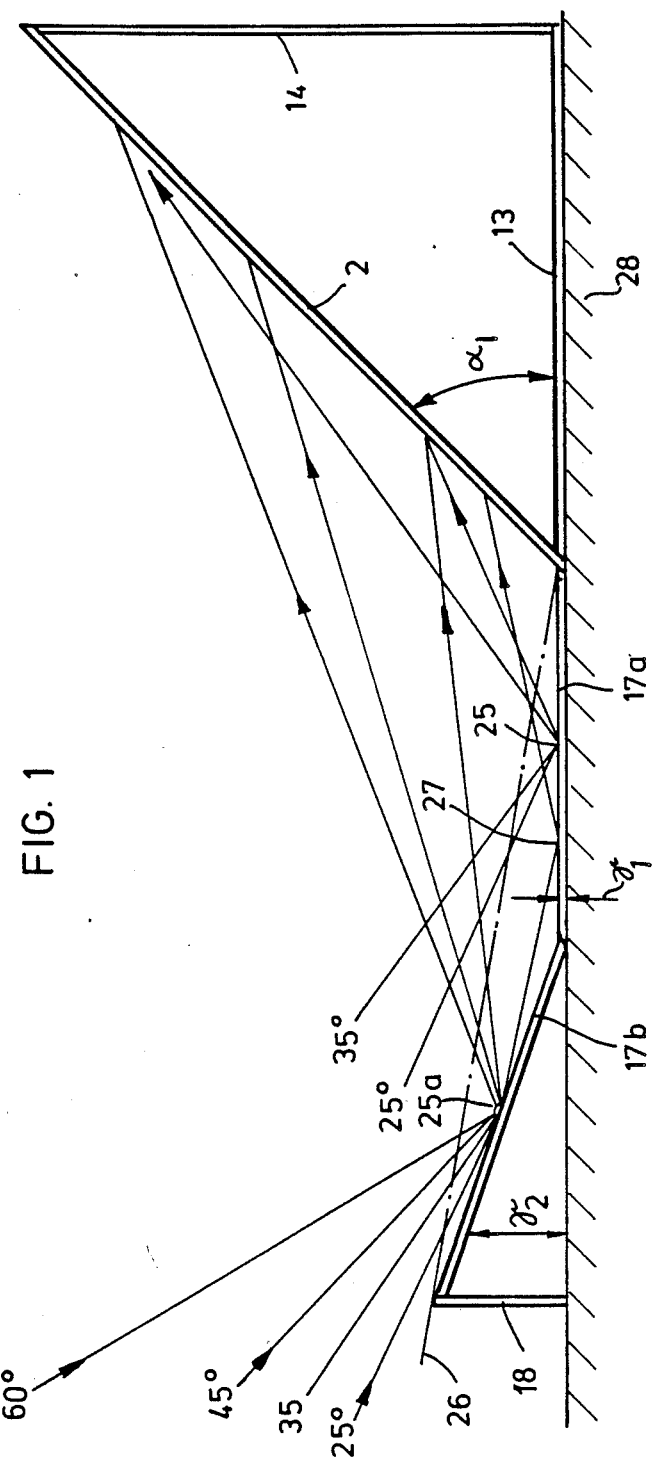
FIG. 1 is a diagrammatic side view of a first embodiment.

FIG. 1 shows to the right an absorber 2, which by means of support 14 and ground rod 13 is placed on the ground or a flat roof 28 at an angle of inclination α with respect to ground 28, which in this case is 45°. There is no need to explain this, because it is well known to the Expert. The absorber 2 can be integrated into an accumulating or storage means, which is provided with transparent thermal insulation materials, as is also known.

Right is north and left is south. To the south, the reflecting surface 17a is connected to absorber 2 and its inclination γ 1 with respect to the ground 28 is equal to 0. To the left or south reflecting surface 17b is connected to reflecting surface 17a and its angle of inclination γ 2 with respect to the ground 28 is 20°. Therefore the associated carrying member is carried by support 18 at the south end.

As a result of the different inclination angles of the two reflecting surfaces 17a and 17b, there is in this case the dot-dash building line 26 of 10°. This means that all solar radiation higher than 10° coming precisely from the south is additionally cast onto the absorber by the reflecting surfaces.

Only some of the different radiation levels acting on the reflectors are shown. The solar radiation directly striking absorber 2 is not shown for reasons of clarity.

To the left, it is firstly possible to see the 25° ray or beam, which strikes in the central point 25a of the reflecting surface 17b and from there is reflected to point 27 of the reflecting surface 17a, from where it is reflected onto absorber 2. Due to the different inclinations γ 1 and γ 2, the low sunrays are consequently not directly reflected by reflector 17b and are instead firstly reflected onto reflector 17a and from there pass to absorber 2.

The situation is different with the higher sunrays. The 35° beam or ray also arrives at point 25a and from there is directly reflected onto absorber 2. The same applies with regards to the even higher sunrays. The 60° ray is also largely reflected onto absorber 2.

In addition, these higher sunrays also pass directly onto the reflecting surface 17a and from there are deflected onto the absorber 2.

As can be seen in FIG. 1, the rays cross at different points, so that as a result there is a reinforcement, which would not occur in the case of a singly continuous reflecting surface without the subdivision and the different inclinations.

The further advantage occurs that the reflecting surfaces of both reflectors 17a and 17b can together be larger than in the case of a unitary or uniform reflector, because through the latter the high solar radiation would largely be significantly upwardly deflected. In the present case, this only applies with regards to one reflecting surface 17a, whereas in the case of the other reflector 17b the high solar radiation up to 60° is largely deflected onto absorber 2.

The remaining construction of the solar installation and also the reflector arrangement is known from the preceding patent and consequently need not be explained here.

The possibility also exists here of fitting additional reflectors to the upper north edge and also to subdivide the reflecting surface with different angles as in FIG. 1.

Figure 2:
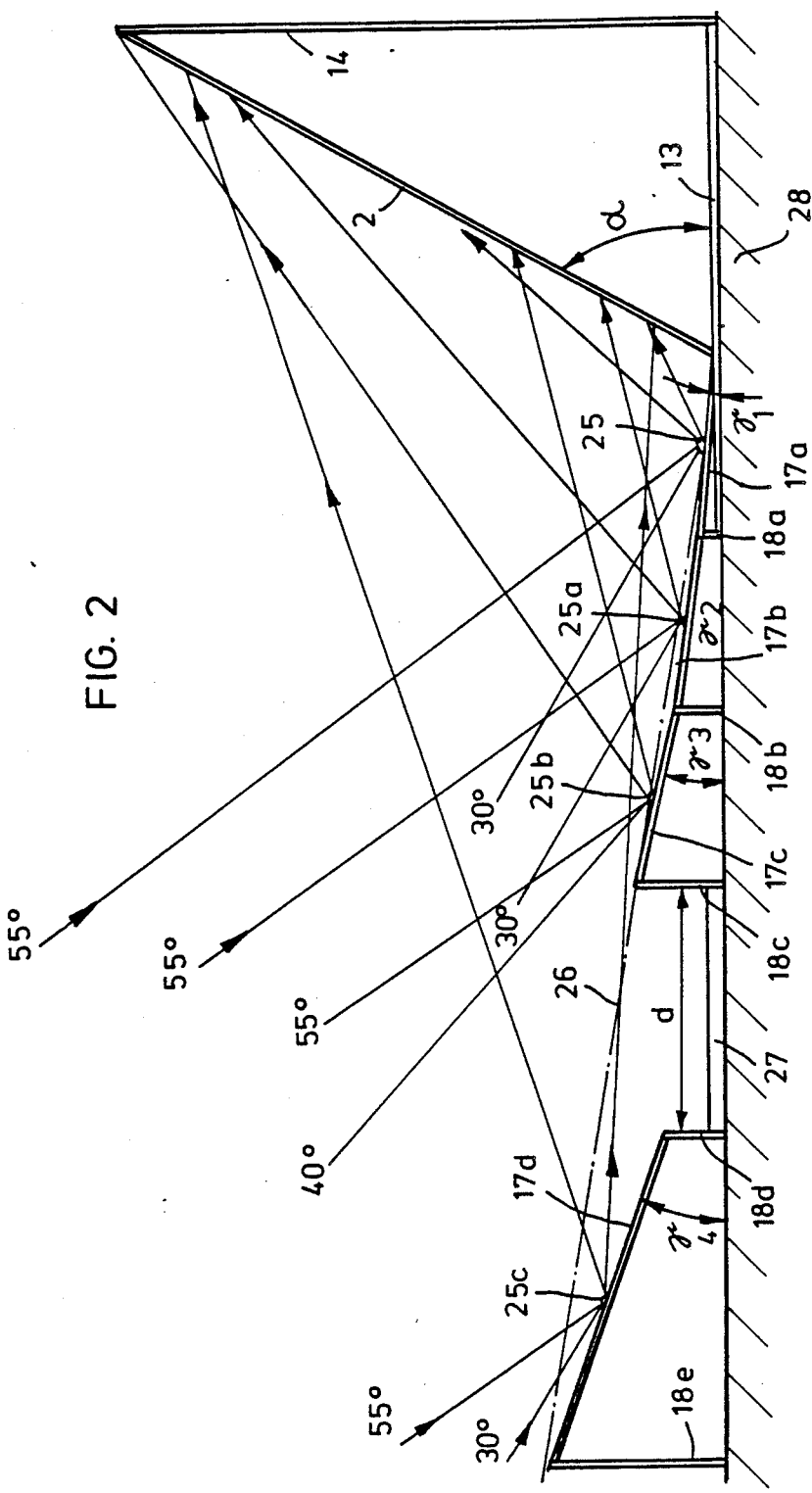
FIG. 2 is a view as in FIG. 1 of a further embodiment.

FIG. 2 shows an angle of inclination α of absorber 2 of 60°, as is favorable in winter and in transition periods. To the bottom of absorber 2 are connected three reflecting surfaces 17a, 17b, 17c with different inclinations γ 1, γ 2 and γ 3 with respect to the horizontal 28, whereby the latter can once again be a flat roof or a horizontal outdoor ground surface. γ 1 is 5°, γ 2 is 10° and γ 3 is 15°. Thus, the building line 26 is once again in the range of only 10° for the reasons given hereinbefore.

At a distance d is provided a fourth reflecting surface 17d with an inclination of γ 4=25°. As a result of the spacing d, which is ensured by a spacer 27, said reflecting surface 17d is also kept within the building line 26 of only 10°. The carrying members which are not shown in detail here for the different reflecting surfaces are also supported by supports 18a, 18b, 18c, 18d and 18e.

The sunrays strike centers 25, 25a, 25b and 25c of the reflecting surfaces 17a, 17b, 17c and 17d, respectively, and, as shown, are reflected from there onto absorber surface 2. Even the 55° radiation, which also strikes reflecting surface 17d, still reaches the upper part of the absorber surface 2. The 30° radiation striking at the same point 25c also largely reaches absorber 2. However, here there is a slight shading by reflecting surface 17c. This could be further significantly reduced by increasing spacing d and simultaneously also increasing angle γ 4 somewhat. By means of a computer calculation it is possible to so optimize d and γ 4 as a function of the local radiation conditions, that there is virtually no reciprocal shading through the other reflecting surfaces and this naturally also includes the size of the reflecting surface 17d. The smaller the latter is chosen, the smaller the risk of shading by reflecting surface 17c. However, a certain shading or shadowing can be accepted, if as a result high solar radiation can additionally be significantly used, as is the case according to FIG. 2.

This offers the possibility of usefully arranging a random number of additional reflecting surfaces 17 in the inventive manner, so that it is possible to achieve a correspondingly high concentration with correspondingly high temperatures if sufficient ground area is available. In these circumstances, there is no need to use north reflecting surfaces.

Thus, the invention provides the possibility of economically producing higher temperatures in a shorter time using the same collectors, so that the absorber surface 2 can be kept much smaller than hitherto.

This also applies in the case of use with solar cell modules. Admittedly, as a result of the higher temperatures, their efficiency is reduced somewhat in known manner. However, of late, water-sprinkled solar cell modules with constant cooling are known and also hybrid modules are not affected by this. Decisive importance is attached to the very low price of the reflecting surfaces, if they are e.g. formed by reflecting foils, which are fastened to wooden boards.

In addition, the collector field 2 can be integrated onto or into the sloping roof of a building in known manner and in such a way that the actual field forms the roofing. In this case the building can be constructed in such a way that the reflecting surface 17 is located on a flat roof 28 adjacent thereto, which means that the roof and the roof truss of the building can also be constructed in this way. In this case, the reflecting surfaces 17 can form the roofing. Reflecting tiles, which can be laid in waterproof manner on the roof are known for this purpose. However, plastic reflecting plates or a reflecting roofing are also suitable.

For this purpose, the flat roof can be inclined somewhat from south to north, e.g. at an angle of 10°, so that rainwater can run off. It is obvious to the building Expert, that he can also provide a gutter for this purpose.

Figure 3:
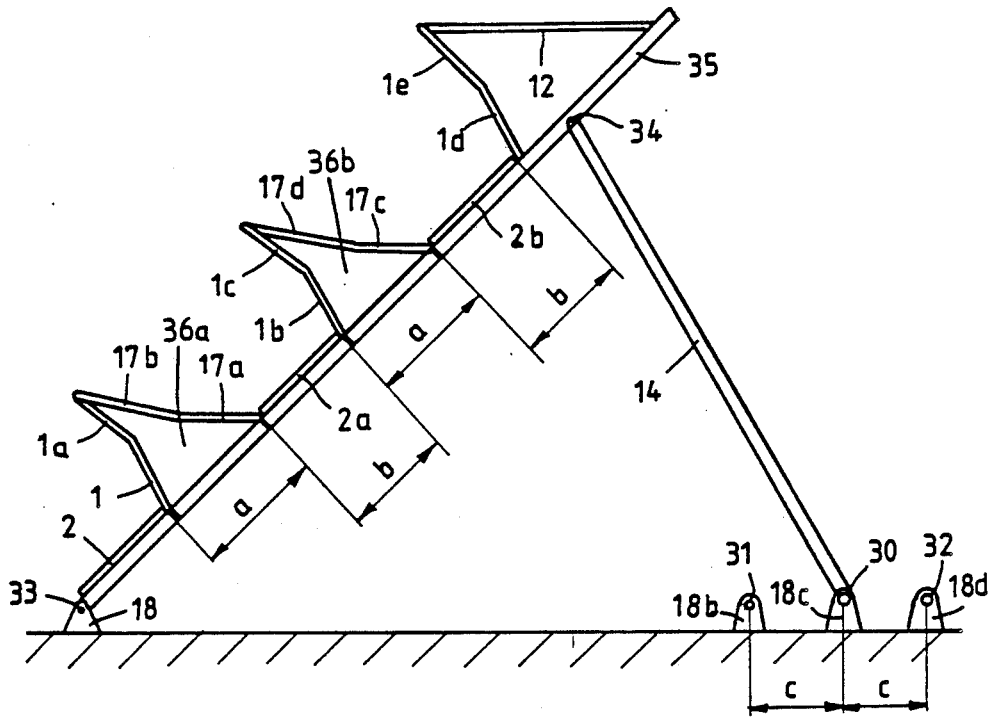
FIG. 3 is a view as in FIG. 1 of a further embodiment.

FIG. 3 is a side view of a frame with a common, rigid, linear support 35, which is fixed by means of a hinge 33 to the ground support 18a, on which are arranged the collectors or solar cell modules 2, 2a, 2b at distances a from bottom to top or to the right, i.e. from south to north. Distance a must not exceed 200 mm, so that use can also be made of diffuse radiation.

The invention uses as a basis the finding that, contrary to the scientific literature, a ray can be reflected over a short distance if it is caused by a cloudy sky and not by deep shadow.

For supporting reflectors 1, 1a and 17a, 17b a wooden board 36a fixed to support 35 is provided and further upwards is located board 36b.

It is firstly possible to see at the north edge of the collector reflector 1, to which reflector 1a is connected at the top. The latter is connected to reflector 17b, to which is connected to the right and therefore the south a reflector 17a. These two reflectors 17a, 17b consequently form the lower south reflector for the collector row 2a. To the north edge are again connected the reflectors 1b, 1c, as well as 17d, 17c. The latter consequently form the south lower reflector for collector row 2b, to which are connected at the top reflectors 1d and 1e, which are held by the horizontally located support 12 for receiving the wind load. In the upper area, ground support 14 is fixed by means of joint 34 to support 35. At the bottom, support 14 is fixed to ground support 18c at point 30. In order to now modify the angle of inclination of support 35, the possibility exists of connecting at the bottom ground support 14 either with support 18b at point 31 or support 18d at point 32, supports 18 being at a distance c from one another.

This is established on a seasonal basis. Thus, there are different inclination angle settings for support 35 in Spring, Summer, Autumn and Winter, so that automatically there is a modification of the setting of all the collectors or solar modules, as well as all the reflectors, with respect to the horizontal.

Figure 4:
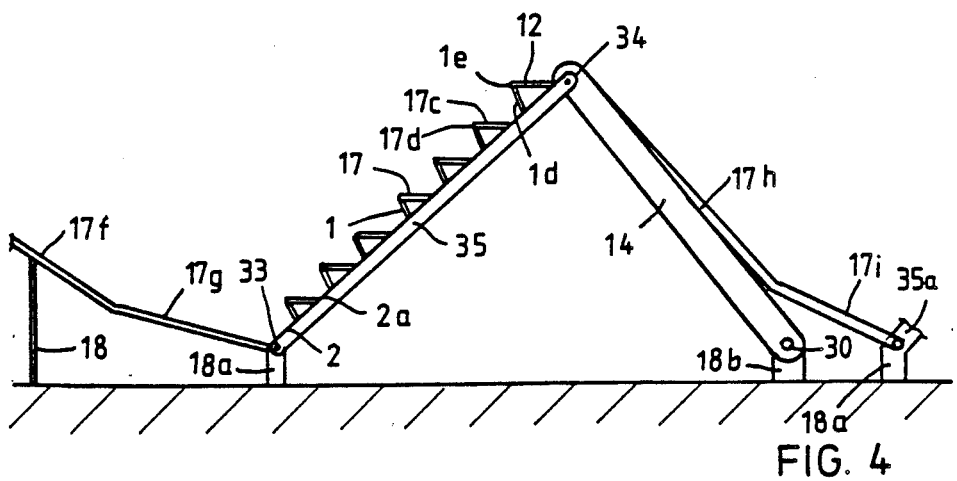
FIG. 4 is a further view as in FIG. 1, but of a larger installation.

FIG. 4 makes it clear that the size of the installation is not subject to any limits, despite the relatively small dimension a. Thus, the frame with supports 14, 35 need not be made excessively large and instead a random number of rows of such frames can be provided in the north-south direction.

Firstly, the frame comprising supports 18a, 35, 14, 18b with the collectors and solar modules and the interposed mirrors 1, 17 are as hitherto and need not be described again. In this case the adjustability through the different supports can be obviated, so that only support 18b for the ground support 14 is provided.

As a result of this reflector arrangement with the large reflectors an additional concentration according to the same inventive diagram as hitherto described is made possible, so that there is no need to explain the operation again. It is immediately apparent that in addition to the small reflectors on supports 35, the large reflectors 17f, 17g now come into action, so that there is a further concentration in part via the small reflectors and in part also directly to the collectors.

Further to the right on the north side, it can be seen that a further additional large reflector 17h is fitted to support 14 and for this purpose the latter has naturally been positioned at the desired angle. Thus, as a result of reflector 17a, there is no additional shadowing for the further north frame with support 35.

Further to the right to the large reflector 17h is connected the large reflector 17i, which is once again supported on support 18a of further north frame rows, the frame being the same as described hereinbefore.

It is possible to provide a random further number of frames for extending the installation to the south or north. It is also possible to extend the frames to the east and west.

Figure 5:
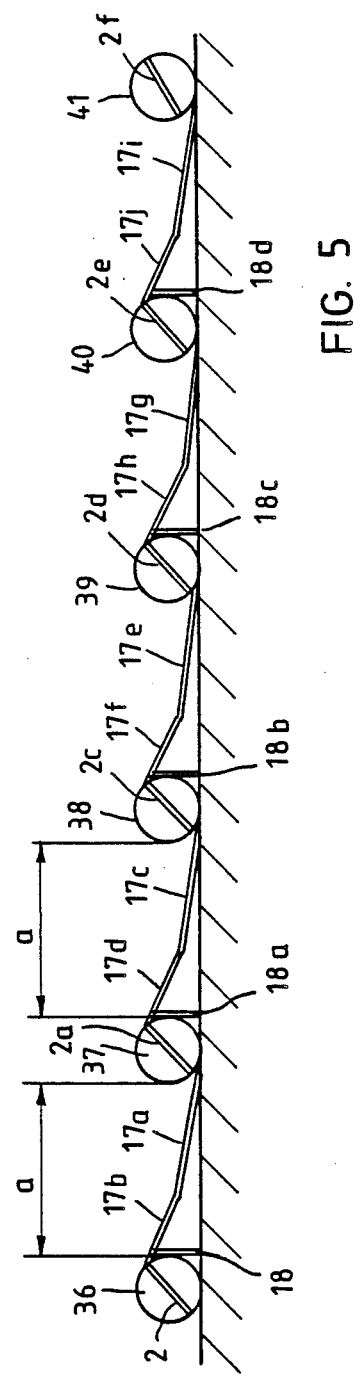
FIG. 5 is a diagrammatic side view of yet a further embodiment.

FIG. 5 diagrammatically shows a vacuum tube collector installation with tubes 36 to 41, in which are arranged absorbers 2-2f in known manner, so that there is no need to explain this. It is also known to slope the absorbers 2, 2a, 2c, 2d, 2e, 2f to the left or south in said tubes.

As stated hereinbefore, there is a distance a between the absorbers, where the south reflectors 17 are arranged between the lower edge of the north absorber and the upper edge of the south absorber. It is decisive that through reflectors 17, on the short distance not only is additional use made of the direct solar radiation, but there is also a reinforcement or intensification of the diffuse radiation in the case of a cloudy sky, as has been proved by tests. It has also been proved that the diffuse radiation can be reflected over a relatively short distance by a white pain or color just as well as by a reflecting metal foil or some other industrial reflecting surface. However, direct solar radiation is reflected much better by a metal foil.

In a further embodiment, the reflecting surfaces 1, 17 with their associated carrying members in a side view from east to west comprise curved surfaces, so that there is a gradual transition from the smaller inclination angle $\gamma$ 1 to the larger inclination angle $\gamma$ 2, $\gamma$ 3. This is not shown in the drawing, because it is obvious to the Expert. It means that the reflecting surfaces 1, 17 are constructed in curved manner and not as flat plates, but otherwise the arrangement is the same.

This is particularly favorable if there are no planar surfaces as carrier members, such as wooden boards or the like. Particularly, if metal or plastic sheets are used as carriers for the reflecting surfaces, the costs are relatively low if the carrier members are shaped together with the reflecting surfaces. As a result of the gradual transition there is naturally also a somewhat greater concentration compared with the aforementioned planar reflecting surfaces.

It is also preferred that in the areas extending laterally beyond the absorber surfaces, the upper edge of the reflecting surfaces is directed downwards in the sense that the width of the reflecting surfaces with their associated carrier members only decreases in said are to adapt to the movement of the sun. As is known, the sun is lower in the morning and evening than at midday. Thus, this measure ensures an adaptation to the movement of the sun, so that the reflecting surfaces, e.g. 17b in FIG. 1, with the higher angle of inclination, free the path for the other reflecting surfaces 17a and do not lead to significant shading at sunrise and sunset. It is also possible to provide a gradual adaptation.

Figure 6:
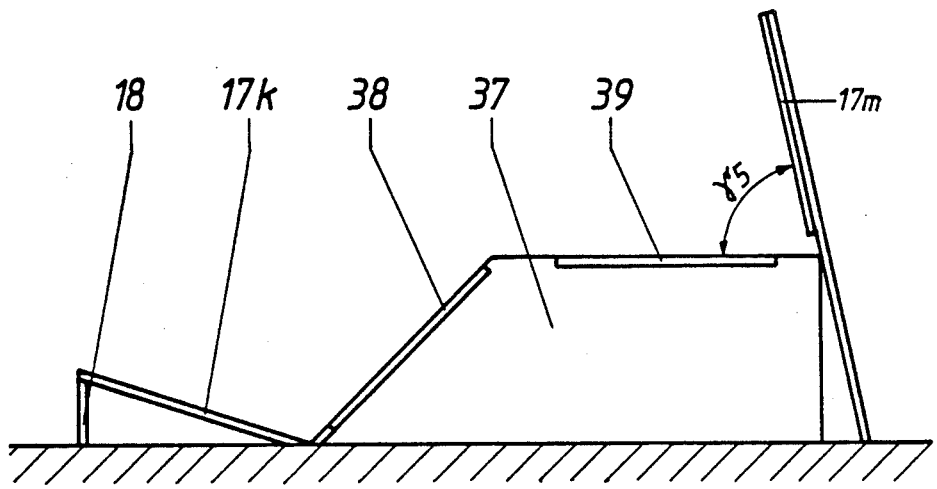
FIG. 6 is a view according to FIG. 1 of a further embodiment.

FIG. 6 shows an embodiment with a storage or accumulating container 37 which, according to the invention, is not only provided in the south with a transparent thermal insulation material 38, but is also provided with a thermal insulation material 39 at the top.

In the areas of said transparent thermal insulation materials 38, 39, container 37 is constructed as an absorber, so that there is no need for an additional absorber surface. As can be seen, to the left or south the container 37 slopes at an angle e.g. 45°, whereas it is perpendicular to the right or north. The action of reflector 17k on the absorber surface behind the transparent thermal insulation material 38 is the same as hitherto.

According to the invention, additional thermal insulation material 39 is provided in the top area of container 37 and below it said container is constructed as an absorber of a known type, so that there is no need to explain this. At the north edge of the container reflector 17m is at an angle $\gamma$ 5 of e.g. 80°, which can also be subdivided. In addition, it projects to the east and west well beyond the absorber 39. Thus, in particular the low solar radiation is additionally deflected onto the absorber surface behind the transparent thermal insulation material 39, so that container 37 naturally in total produces at least twice as much heat. Reflector 17m also reflects the very low solar radiation shortly after sunrise and before sunset. It is also possible to provide the east and west sides of container 37 with additional transparent thermal insulation material, which is located behind a glass plate or a transparent plastic sheet. This makes it possible to additionally make use of the very low solar radiation early morning and late evening, particularly in Winter. This is not shown in FIG. 6, but is readily apparent to the Expert.

If all these measures are performed only the north wall and bottom of container 37 are not provided with transparent thermal insulation material and behind which the container wall is constructed as an absorber. Reflector 17m deflects its radiation partly onto said lateral surfaces in the east and west, particularly morning and evening in Winter.

Figure 7:
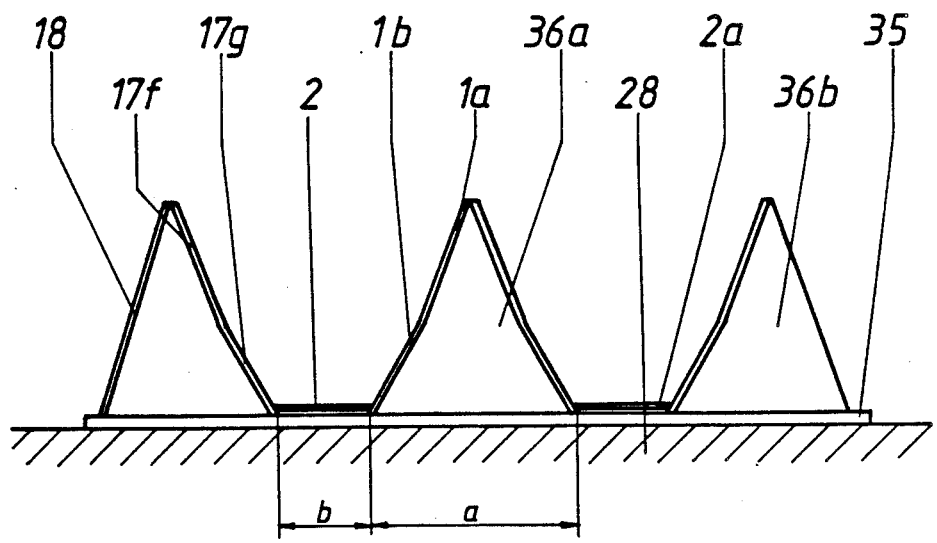
FIG. 7 is a view according to FIG. 1 of a final embodiment.

FIG. 7 shows a further embodiment, which is particularly suitable for countries close to the Equator. As is known, at the Equator the sun rises precisely in the east and sets precisely in the west and also rises and sets precisely vertically. Thus, there is no need for an adjustment for the different seasons, as was described hereinbefore.

The linear support 35 is in this case positioned horizontally on the ground or flat roof 28. The collectors or solar cell modules 2, 2a are reciprocally arranged with a width b and a spacing a, much as in FIG. 3. Distance a can be much greater here, because there is no risk of shading by the reflectors at the Equator. It is necessary to accept that as a result of large distances or spacings a, the diffuse radiation of the upper reflector 1a, 17f will only be slightly reflected. However, there are higher concentration levels, because the reflectors are much larger. Otherwise the arrangement and references are the same as in FIG. 3.

What is claimed is:

1. A solar installation having, in combination;
   (a) at least one of planar absorbers and solar cells arranged in a collector field, said collector field being fixed in non-trackable manner in a carrier therefor,
   (b) reflecting surfaces extending laterally beyond the one of planar absorber and solar cell surfaces in shading free manner with respect to the same,
   (c) the reflecting surfaces having associated carrier members, said reflecting surfaces with said associated carrier members being subdivided into at least two reflecting surfaces, the inclinations of said reflecting surfaces increasing with increase in distance from the at least one of absorbers and solar cells from the horizontal, and
   (d) a spacing between at least two of the reflecting surfaces.

2. A solar installation according to claim 1, in which the collector field is arranged in a storage or an accumulating container with transparent thermal insulation material, there being plural absorber surfaces with insulating material, whereof one said absorber surface is positioned horizontally and an approximately vertical reflector is associated with said absorber surface.

3. A solar installation according to claim 1, wherein the collector field is arranged in spaced rows, the reflector surfaces being arranged between the spaced rows of the collector field.

4. A solar installation according to claim 3, wherein the distance between the rows of the collector field in which the reflecting surfaces with their associated carrier members are arranged does not exceed 200 mm.

5. A solar installation according to claim 3, wherein the collectors with their associated carrier members are arranged on common rigid supports whose angles can be fixed by further supports.

6. A solar installation according to claim 5, further including a sloping ground support, acting on the upper edge of the rigid support, said sloping support having an additional large reflector disposed on a common support.

7. A solar installation according to claim 5, wherein the rigid support is horizontally fitted in a non-adjustable manner.

8. A solar installation according to claim 3, wherein the distance between the rows of the collector field is no larger than 120 mm.

9. A solar installation according to claim 1, further including a vacuum tube collector installation having spaced tubes and absorbers in said tubes and sloping therein.

10. A solar installation according to claim 1, wherein the reflecting surfaces with their associated carrier members are curved in side view, so that there is a gradual transition from the smaller angle of inclination ($\gamma$ 1) to the larger angles ($\gamma$ 2, $\gamma$ 3).

11. A solar installation according to claim 1, wherein the upper edge of the reflecting surfaces in the areas thereof extending laterally beyond the absorber surfaces is directed downward in the sense that the width of the reflecting surfaces in said area decreases to adapt to the movement of the sun.

12. A solar installation according to claim 1 further including a surface generally at an acute angle to the horizontal, said collector field being secured to said surface.

* * * * *